(12) United States Patent
Prosyk et al.

(10) Patent No.: US 11,988,872 B2
(45) Date of Patent: May 21, 2024

(54) OPTICAL WAVEGUIDE COUPLING USING FABRICATED WAVEGUIDE COUPLING STRUCTURES

(71) Applicant: Ciena Corporation, Hanover, MD (US)

(72) Inventors: Kelvin Prosyk, Luskville (CA); Ronald Richard Millett, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/536,392

(22) Filed: Nov. 29, 2021

(65) Prior Publication Data

US 2023/0168430 A1   Jun. 1, 2023

(51) Int. Cl.
| | |
|---|---|
| *G02B 6/26* | (2006.01) |
| *G02B 6/02* | (2006.01) |
| *G02B 6/136* | (2006.01) |
| *G02B 6/14* | (2006.01) |

(52) U.S. Cl.
CPC ............ *G02B 6/26* (2013.01); *G02B 6/02* (2013.01); *G02B 6/136* (2013.01); *G02B 6/14* (2013.01)

(58) Field of Classification Search
None
See application file for complete search history.

(56) References Cited

U.S. PATENT DOCUMENTS

| | | | | |
|---|---|---|---|---|
| 7,184,207 | B1* | 2/2007 | Walker | G02F 1/025 |
| | | | | 359/344 |
| 9,709,738 | B1* | 7/2017 | Dumais | G02B 6/14 |
| 2002/0031304 | A1* | 3/2002 | Roberts | G02B 6/1228 |
| | | | | 385/28 |
| 2002/0154393 | A1* | 10/2002 | Hamamoto | H01S 5/50 |
| | | | | 359/344 |
| 2004/0131310 | A1 | 7/2004 | Walker | |
| 2005/0036737 | A1* | 2/2005 | Stuart | G02B 6/122 |
| | | | | 385/33 |
| 2007/0110363 | A1* | 5/2007 | Miyadera | G02B 6/2813 |
| | | | | 385/27 |
| 2007/0258681 | A1 | 11/2007 | Takabayashi et al. | |
| 2009/0279838 | A1* | 11/2009 | Fattal | G02B 6/122 |
| | | | | 257/E31.003 |

(Continued)

FOREIGN PATENT DOCUMENTS

| | | |
|---|---|---|
| JP | 2011258785 A | 12/2011 |
| WO | 2007036704 A1 | 4/2007 |
| WO | WO-2017159044 A1 * | 9/2017 ........... G02B 6/1228 |

*Primary Examiner* — Chris H Chu
(74) *Attorney, Agent, or Firm* — Young Basile Hanlon & MacFarlane, P.C.

(57) ABSTRACT

First and second waveguide structures are coupled to a waveguide coupling structure, the first waveguide structure comprising a first guiding core structure formed on a first cladding structure, and a second cladding structure formed on the first guiding core structure. The first and second waveguide structures have respective guiding ridges. The second waveguide structure comprises a second guiding core structure formed on a third cladding structure, and a fourth cladding structure formed on the second guiding core structure. The waveguide coupling structure comprises a transition structure, a multimode interference structure between the transition structure and the second waveguide structure, and an electrode over at least a portion of the guiding ridge within the second cladding structure and over at least a portion of the transition structure.

20 Claims, 13 Drawing Sheets

(56) References Cited

U.S. PATENT DOCUMENTS

| | | | |
|---|---|---|---|
| 2011/0134513 A1* | 6/2011 | Kim | G02B 6/2813 |
| | | | 359/344 |
| 2011/0188804 A1* | 8/2011 | Okamoto | H01S 5/026 |
| | | | 385/24 |
| 2014/0086522 A1* | 3/2014 | Adams | G02B 6/125 |
| | | | 385/14 |
| 2018/0335572 A1* | 11/2018 | Ma | G02B 6/29344 |
| 2020/0192131 A1* | 6/2020 | Delisle-Simard | G02F 1/025 |
| 2020/0381899 A1 | 12/2020 | Macquistan et al. | |

* cited by examiner

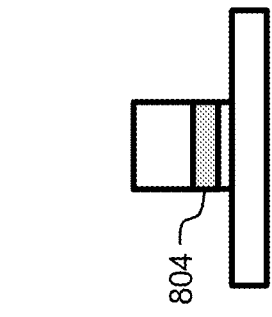
FIG. 8C
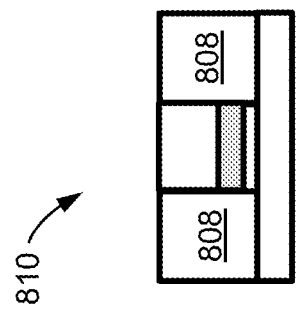
FIG. 8E
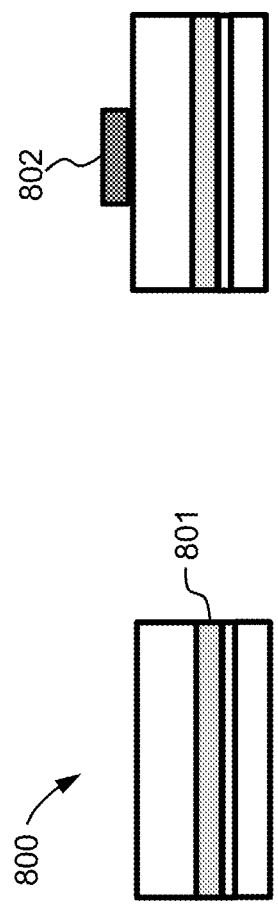
FIG. 8B
FIG. 8D
FIG. 8A

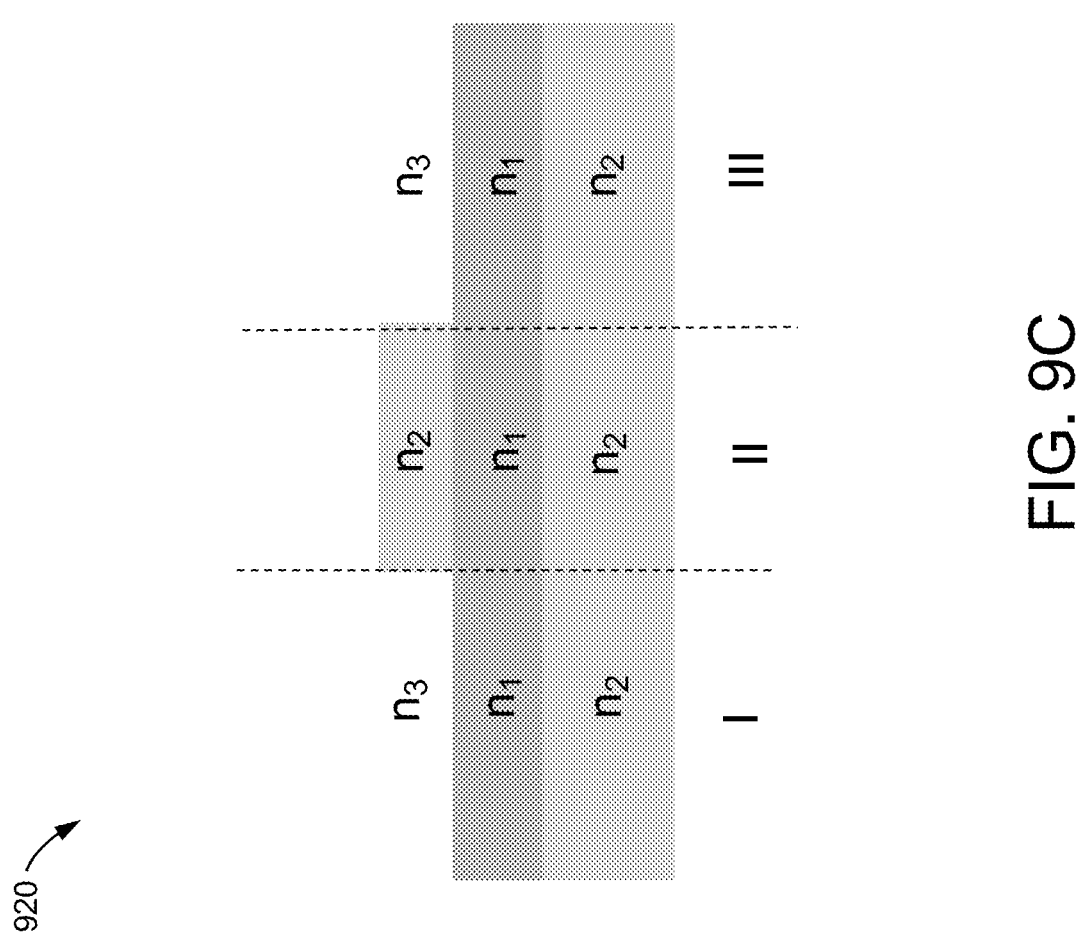

OPTICAL WAVEGUIDE COUPLING USING FABRICATED WAVEGUIDE COUPLING STRUCTURES

TECHNICAL FIELD

This disclosure relates to optical waveguide coupling using fabricated waveguide coupling structures.

BACKGROUND

An optical waveguide can include structures such as a guiding core structure (or simply a "core") and cladding structures that are fabricated from layers of materials (e.g., semiconductor materials) that are etched in a fabrication process, such as those used for photonic integrated circuits on indium phosphide (InP) substrates. Structures can be fabricated to couple an optical waveguide with certain properties to another optical waveguide with different properties. For example, one waveguide may have weak lateral guiding and another waveguide may have strong lateral guiding, as describe in more detail below.

SUMMARY

In one aspect, in general, an article of manufacture comprises: a first waveguide structure supporting a first optical mode coupled to a waveguide coupling structure, the first waveguide structure comprising a first guiding core structure formed on a first cladding structure, and a second cladding structure formed on the first guiding core structure, where the first waveguide structure has a guiding ridge of a first width; and a second waveguide structure supporting a second optical mode coupled to the waveguide coupling structure, the second waveguide structure comprising a second guiding core structure formed on a third cladding structure, and a fourth cladding structure formed on the second guiding core structure, where the second waveguide structure has a guiding ridge of a second width. The waveguide coupling structure comprises a transition structure having a third width larger than the first width and larger than the second width, a first multimode interference structure between the transition structure and the first waveguide structure having a width larger than the first width and smaller than the third width, and a second multimode interference structure between the transition structure and the second waveguide structure having a width larger than the second width and smaller than the third width.

Aspects can include one or more of the following features.

The guiding ridge of the first waveguide structure has a first depth relative to a top plane that is above a radius of the first optical mode; the guiding ridge of the second waveguide structure has a second depth relative to the top plane that is larger than the first depth; the first multimode interference structure has a height substantially equal to the first depth; and the second multimode interference structure has a height substantially equal to the second depth.

The first depth of the guiding ridge of the first waveguide structure extends to a plane within the second cladding structure.

The second depth of the guiding ridge of the second waveguide structure extends through the fourth cladding structure to a plane within the third cladding structure.

The transition structure overlaps with a plane that is transverse to the top plane and that intersects a propagation axis of the first optical mode at a location that is between (1) an image plane between the first waveguide structure and the first multimode interference structure, and (2) a transform plane at which there is a phase shift of between a fundamental mode and first harmonic mode associated with the first optical mode.

The transition structure overlaps with a plane that is transverse to the top plane and that intersects a propagation axis of the first optical mode at a location that is between (1) an image plane between the first waveguide structure and the first multimode interference structure, and (2) a critical reflection plane at which a predetermined threshold of optical power coupled from the first waveguide structure first reaches an edge of the first or second multimode interference structure.

The first waveguide structure, the second waveguide structure, the first multimode interference structure, the second multimode interference structure, and the transition structure all have a top surface at the top plane.

The first waveguide structure is characterized by a first effective lateral index contrast associated with the first optical mode, and the second waveguide structure is characterized by a second effective lateral index contrast associated with the second optical mode that is larger than the first effective lateral index contrast.

The guiding ridge of the second waveguide structure is more deeply etched than the guiding ridge of the first waveguide structure.

The first waveguide structure comprises a buried heterostructure waveguide.

The width of the first multimode interference structure is larger than the width of the second multimode interference structure.

The first width of the guiding ridge of the first waveguide structure is different from the second width of the guiding ridge of the second waveguide structure.

The first width of the guiding ridge of the first waveguide structure is smaller than the second width of the guiding ridge of the second waveguide structure.

The first guiding core structure is formed from a layer of a first material that extends into the first multimode interference structure and ends at a butt joint, and the second guiding core structure is formed from a layer of a second material that extends into the first multimode interference structure and ends at the butt joint.

The butt joint is within the transition structure.

In another aspect, in general, an article of manufacture comprises: a first waveguide structure supporting a first optical mode coupled to a waveguide coupling structure, the first waveguide structure comprising a first guiding core structure formed on a first cladding structure, and a second cladding structure formed on the first guiding core structure, where the first waveguide structure has a guiding ridge of a first width; a second waveguide structure supporting a second optical mode coupled to the waveguide coupling structure, the second waveguide structure comprising a second guiding core structure formed on a third cladding structure, and a fourth cladding structure formed on the second guiding core structure, where the second waveguide structure has a guiding ridge of a second width. The waveguide coupling structure comprises a transition structure having a third width larger than the first width and larger than the second width, a multimode interference structure between the transition structure and the second waveguide structure having a width larger than the first width and smaller than the third width, and an electrode over at least a portion of the guiding ridge within the second cladding structure and over at least a portion of the transition structure.

Aspects can include one or more of the following features.

The first guiding core structure is configured to provide optical gain in the presence of an electric current generated in response to a voltage applied to the electrode.

The first guiding core structure is formed from a layer of a first material that extends into the transition structure and ends at a butt joint, and the second guiding core structure is formed from a layer of a second material that extends into the multimode interference structure and into the transition structure and ends at the butt joint.

The electrode has an edge that is substantially contained in a plane within the transition structure that contains the butt joint.

In another aspect, in general, a method for fabricating an integrated optical coupler comprises: forming a first waveguide structure supporting a first optical mode coupled to a waveguide coupling structure, the first waveguide structure comprising a first guiding core structure formed on a first cladding structure, and a second cladding structure formed on the first guiding core structure, where the first waveguide structure has a guiding ridge of a first width; and forming a second waveguide structure supporting a second optical mode coupled to the waveguide coupling structure, the second waveguide structure comprising a second guiding core structure formed on a third cladding structure, and a fourth cladding structure formed on the second guiding core structure, where the second waveguide structure has a guiding ridge of a second width. The waveguide coupling structure comprises a transition structure having a third width larger than the first width and larger than the second width, a multimode interference structure between the transition structure and the second waveguide structure having a width larger than the first width and smaller than the third width, and an electrode over at least a portion of the guiding ridge within the second cladding structure and over at least a portion of the transition structure.

Aspects can have one or more of the following advantages.

Some of the techniques described herein can be used to fabricate a semiconductor optical amplifier (SOA) having a shallow etch waveguide that is monolithically integrated with, and coupled to, a deep etch optical waveguide at the output. The techniques can be used in a monolithically integrated amplifier-modulator in various semiconductor material systems such as indium phosphide.

The input optical waveguide of the SOA and the output optical waveguides may have guiding cores that are composed of different materials that meet at a butt joint. For example, the guiding core of the input optical waveguide may be formed from a material capable of supplying optical gain. The gain region can be pumped with current and can be configured to enhance certain performance characteristics. For example, a wide ridge in the gain region can be used to reduce gain saturation.

The waveguide coupling structures used to couple the optical waveguides can be configured for low optical transmission loss, and suppression of reflections and/or higher order modes generated either by the waveguide coupling structures themselves or by the butt joint formed by the guiding cores. Since scattering from the butt joint is in a plane distinct from image and transform planes, the waveguide coupling structures can be configured such that unwanted reflections and higher order modes fail to couple to the fundamental launch and output modes, as described in more detail below.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 8A-8E are schematic diagrams of steps in an example fabrication procedure for a buried heterostructure.

FIGS. 9A-9C are schematic diagrams of example waveguide configurations.

DETAILED DESCRIPTION

Figure 1A:
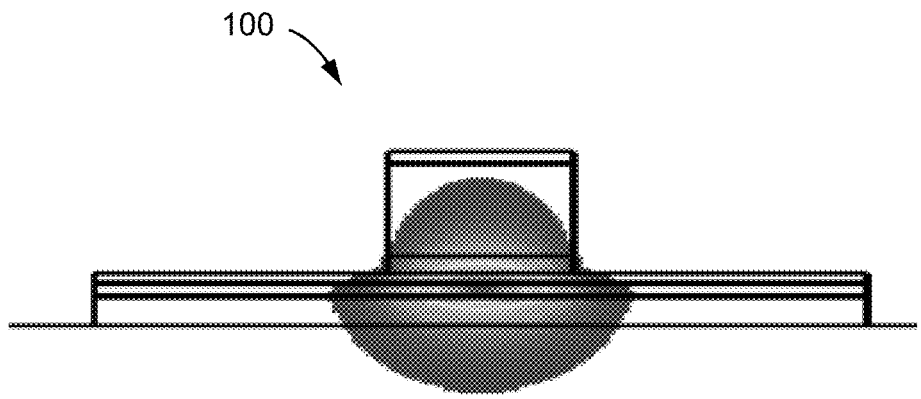
FIG. 1A is a schematic diagram showing a cross-sectional view of a distribution of optical intensity for an optical mode guided by an optical waveguide with weak lateral guiding.
Figure 1B:
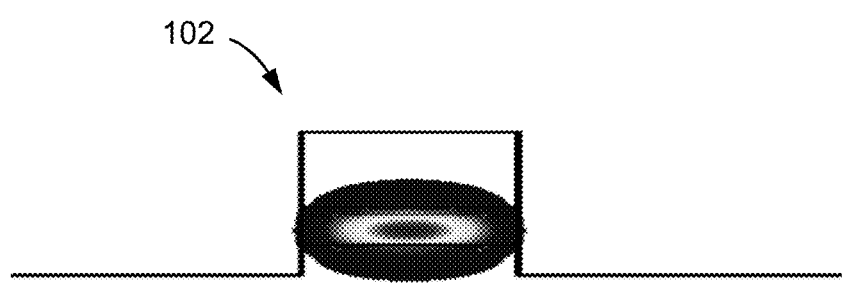
FIG. 1B is a schematic diagram showing a cross-sectional view of a distribution of optical intensity for an optical mode guided by an optical waveguide with strong lateral guiding.

FIGS. 1A and 1B show cross-sectional views of a distribution of optical intensity for an optical mode guided by a shallow etch waveguide 100 (FIG. 1A) (an example of weak lateral guiding) and a deep etch waveguide 102 (FIG. 1B) (an example of strong lateral guiding). In these examples, a "shallow etch" refers to a waveguide in which the etch process for forming the guiding ridge does not penetrate through the one or more layers of material that comprise the guiding core of the waveguide, and a "deep etch" refers to a waveguide in which the etch process for forming the guiding ridge penetrates substantially through all of the one or more layers of material that comprise the guiding core of the waveguide. A shallow etch waveguide can also be referred to as a rib guided waveguide, but as used herein, both of the shallow etch waveguide 100 and the deep etch waveguide 102 include a guiding ridge, as shown in FIGS. 1A and 1B. Both of the shallow etch waveguide 100 and deep etch waveguide 102 use one or more guiding core layer(s) to confine the optical mode in the vertical dimension and use the guiding ridge to confine the optical mode in the horizontal dimension. However, the shallow etch waveguide 100 is relatively weakly guided and the deep etch waveguide 102 is relatively strongly guided due to the less confined optical mode of the shallow etch waveguide 100 and the more confined optical mode of the deep etch waveguide 102, respectively, that result from the different etch depths. These waveguides are optical waveguides since they are configured to guide electromagnetic waves that have a spectrum that has a peak wavelength that falls in a particular range of optical wavelengths (e.g., between about 100 nm to about 1 mm, or some subrange thereof), also referred to as optical waves, light waves, or simply light.

Figure 2A:
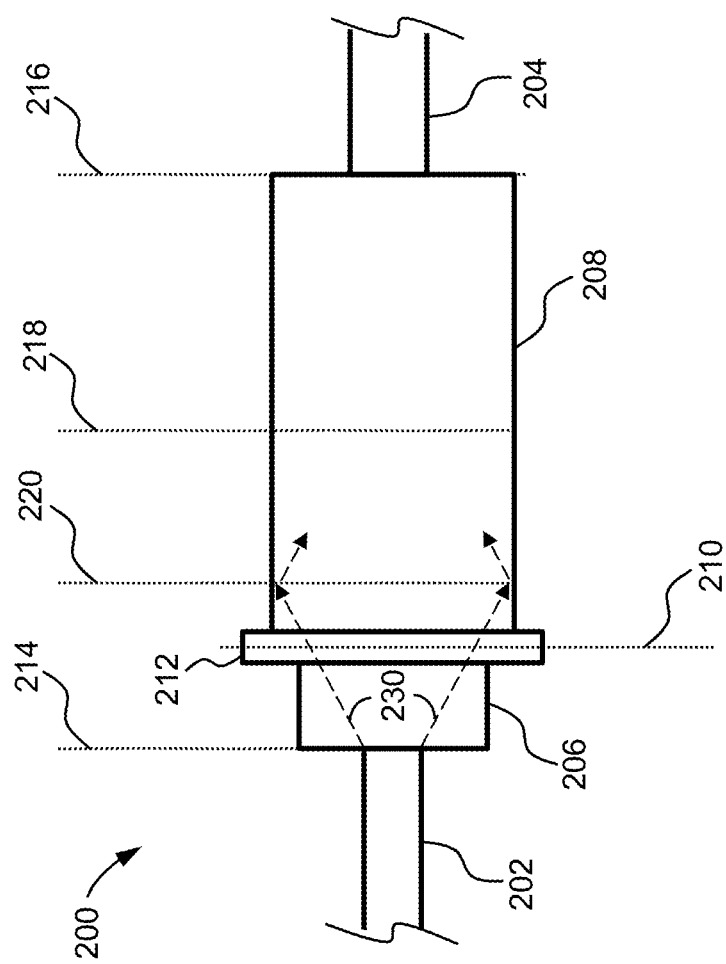
FIG. 2A is a schematic diagram of a top view of an example of a coupling device.

FIG. 2A shows a top view of an example coupling device 200 that includes a shallow etch input waveguide structure 202 and a deep etch output waveguide structure 204. The waveguide structures 202 and 204 may couple to additional optical elements and/or may be a part of other optical devices that are coupled together through the coupling device 200. The waveguide structures 202 and 204 have different widths in this example, with the input waveguide structure 202 being narrower than the output waveguide structure 204, but in other examples, the widths of these waveguide structures can be the same, or the input waveguide structure 202 can be wider than the output waveguide structure 204. The waveguide structures 202 and 204 can be configured such that higher order spatial modes (HOMs) are tolerated in some implementations, or in other implementations it may be desirable to suppress such HOMs and configured the waveguide structure 202 and 204 to limit propagation to the fundamental, or first, mode only, for given operating wavelength(s). Some sub-components on photonic integrated circuits experience performance degradation when coupled to HOMs. For example, uncontrolled HOMs in an SOA can degrade the optical signal-to-noise ratio (OSNR) in high bandwidth fiber optic communications systems. Also, the terms "input" and "output" may only apply to some uses of the coupling device 200, and in other uses, the input and output ports can be reversed with optical waves coupled into the deep etch output waveguide structure 204 and out of the shallow etch input waveguide structure 202.

The coupling device 200 also includes an input multi-mode interference (MMI) structure 206, and an output MMI structure 208. These MMI structures support multiple spatial modes (e.g., a lowest order fundamental mode, and one or more higher order modes) and enable transformation between the fundamental spatial mode of the input waveguide structure 202 and the fundamental spatial mode of the output waveguide structure 204. In contrast to spurious HOMs that may be present in the waveguide structures 202 and 204, the MMI structures 206 and 208 can be configured to incorporate HOMs judiciously to provide a conversion that reduces optical loss, reduces reflections due to scattering, and/or reduces the generation of spurious HOMs in the output waveguide structure 204 due to factors such as manufacturing tolerances. The input MMI structure 206 is etched at substantially the same depth as the shallow etch input waveguide structure 202, and the output MMI structure 208 is etched at substantially the same depth as the deep etch output waveguide structure 204. The MMI structures 206 and 208 have different widths in this example, with the input MMI structure 206 being narrower than the output MMI structure 208, but in other examples, the widths of these MMI structures can be the same, or the input MMI structure 206 can be wider than the output waveguide structure 208. For example, in some implementations, it may be advantageous for the input MMI structure 206 to be wider than the output MMI structure 208 to further reduce reflections coupled back into the input waveguide structure 202. Reflections back into the input waveguide structure 202 will generally decrease as the input MMI structure 206 is made wider.

Figure 2B:
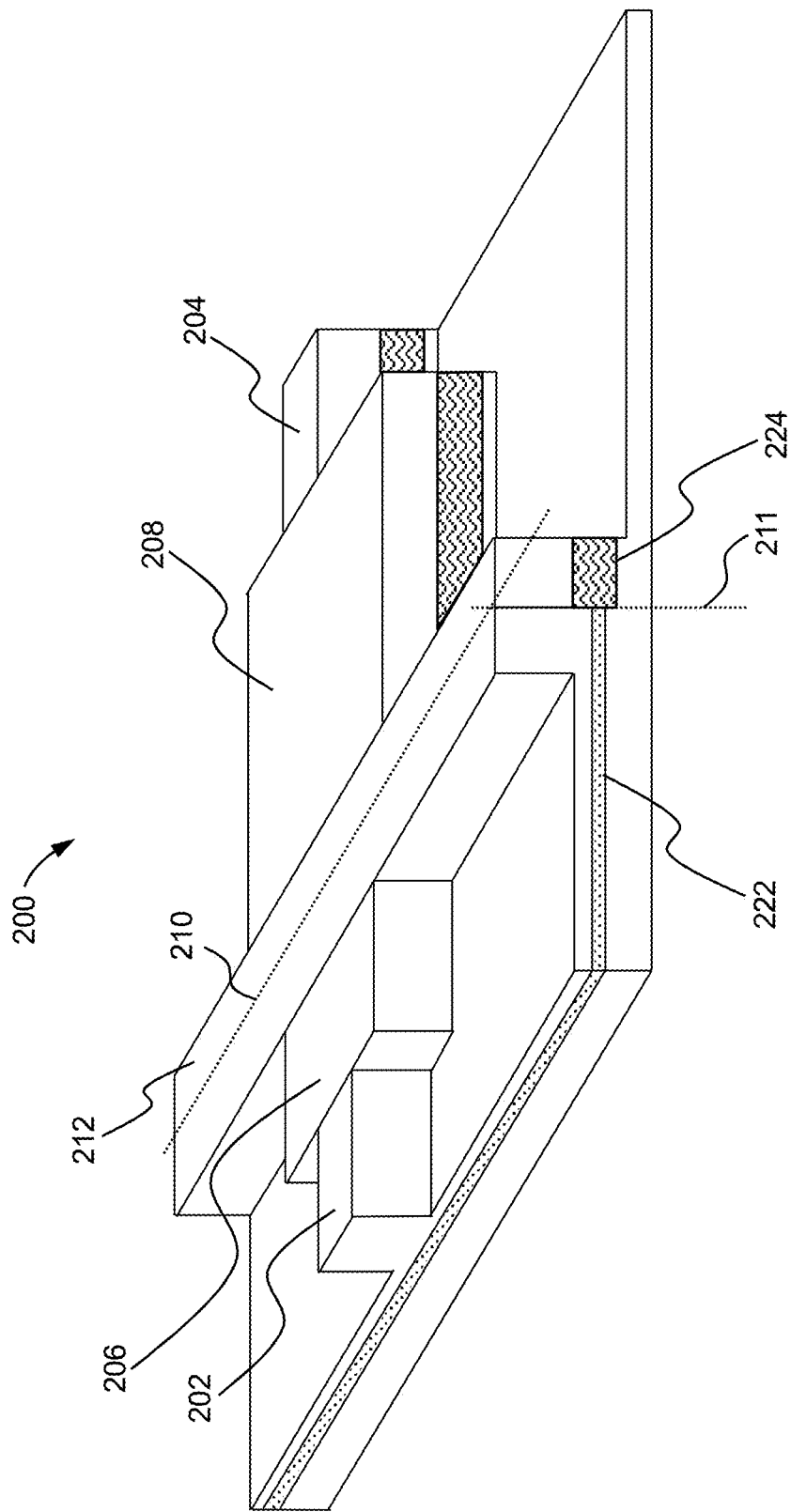
FIG. 2B is a schematic diagram of a perspective view of the coupling device of FIG. 2A.

Due to limited alignment and/or positioning precision during fabrication, a transition structure 212 is included in the coupling device 200 separating the shallow and deep etch portions of the coupling device 200. FIG. 2B shows a cutaway perspective view of the coupling device 200, showing that the transition structure 212 is un-etched over a width that is wider than both the input MMI structure 206 and the output MMI structure 208. For convenience of illustration, the view in FIG. 2B is a cutaway view that shows underlying layers, including a guiding core structure 222 between cladding structures of the shallow etch side, which would not otherwise be visible since it is not exposed due to the shallow etch. Also visible are portions of a guiding core structure 224 between cladding structures of the deep etch side that is exposed due to the deep etch. The exposed portions could then be covered by additional cladding material in a later fabrication step for a fabricated device, or could be left with an air cladding on top. Additionally, while sharp edges and corners are shown in this illustrative example, some edges and corners could be tapered in a fabricated device to mitigate reflections. The FIGS. 2A and 2B show intersection lines 210 and 211, respectively, that are both contained in a "butt joint plane" perpendicular to the plane of the top surface of the structures (the "top plane") at which there is a butt joint between the guiding core structure 222 of the shallow etch side and the guiding core structure 224 of the deep etch side. In some implementations, as in the example of FIGS. 2A and 2B, the butt joint is located within the transition structure 212. While these features are not shown to-scale, they do illustrate that in this example the guiding core structure 224 is thicker than the guiding core structure 222. In some implementations, the material from which the guiding core structure 222 is formed is different from the material from which the guiding core structure 224 is formed.

Together, the input MMI structure 206, transition structure 212, and the output MMI structure 208 form a compound MMI structure that facilitates efficient coupling between input and output waveguide structures of different etch depths. Referring again to FIG. 2A, associated with the input and output waveguide structures and the compound MMI structure are optical planes that correspond to certain optical characteristics of the coupling device 200. These planes are perpendicular to the top plane, and perpendicular to a main propagation axis through the coupling device 200, and are shown by intersection lines on the top view of FIG. 2A. An input image plane 214 defines a location at which the input optical mode of the input waveguide structure 202 begins spatial mode transformation, and an output image plane 216 defines a location at which the spatial mode transformation ends to match the fundamental output optical mode of the output waveguide structure 204. There is also a transform plane 218 and a critical reflection plane 220, described in more detail below. In some implementations, in order to mitigate the effects of potential reflections at the butt joint, the plane at which the butt joint is located is substantially displaced from the transform plane 218 and the critical reflection plane 220, and may be disposed between the input image plane 214 and the critical reflection plane 220 (e.g., about half of the distance between them).

In some devices, a "transform plane" can be described with respect to a beat length, which can be approximated as the point along the length of a simple MMI structure (e.g., with only a single width and single etch depth) at which there is an accumulation of $2\pi$ optical phase difference between a fundamental optical mode and the first harmonic mode associated with the fundamental optical mode. At the beat length, a copy of the optical image present at the input image plane 214 is re-imaged with relatively high accuracy. The output image plane can be located at an integer multiple of this beat length. The transform plane can be described as a distance that is approximately one-half of the beat length, at which there is approximately a $\pi$ optical phase difference between the fundamental mode and its first harmonic, and at which the pattern of light is a maximally transformed version of the input image. For example, if a hypothetical mirror were to be placed at the transform plane, the reflected light could be approximately re-imaged onto the input image plane 214 with a relatively accurate copy of the original optical image present at the input image plane 214.

In the case of a compound MMI structure comprising at least two different etch types and at least two different core compositions, the optical phase difference between the fundamental mode and its first harmonic may accumulate at different rates in different parts of the compound MMI structure. The transform plane in a single-beat compound MMI device will not necessarily be located at the mid-way point between the input image plane and the output image plane. However, the transform plane of such a device, or of the coupling device 200, may still be approximately defined by the point at which π optical phase difference accumulates between the fundamental mode and its harmonic, or by the point at which a hypothetical mirror placed perpendicular to the MMI device would reflect the light to re-image the input image back onto itself with maximum overlap at the input image plane.

Since butt joints can cause reflection, placing a butt joint coincident with the transform plane could result in any reflections being re-imaged onto the input image plane. Such reflections could be maximally coupled back into any optical elements on the input side of the coupling device, which could result in negative impact on device performance. So, in some implementations, in order to mitigate potential butt joint reflections being coupled back into the input image, the butt joint can be located at a plane between the input image plane 214 and the transform plane 218. The resulting reflected light directed at the input plane will then have reduced coupling to the input image.

The mitigation of potential reflections can also be managed based on the location of a "critical reflection plane." As light exits the input image plane 214, a light beam that is no longer confined to the guided spatial mode of the input waveguide structure 202 will expand via diffraction. Referring again to FIG. 2A, the critical reflection plane 220 is at a distance from the input image plane 214 at which light rays 230 defining a cone in which a significant portion of the power of the expanding light beam is contained will hit and reflect inward from the sidewalls of the output MMI structure 208. An example of a quantitative procedure for determining that portion of power, and the resulting location of the critical reflection plane 220 is based on a specification of a critical maximum relative fraction of the light interacting with the sidewall before encountering a perturbative discontinuity such as the butt joint within the transition structure 212. Defining a relatively tight specification (e.g., no greater than 0.1% of the optical amplitude) will result in a critical reflection plane location that is close to the input image plane 214, so the diffracting beam of light has little chance to expand laterally outwards. Alternatively, defining a relatively loose specification (e.g., no greater than 5% of the optical amplitude), will result in a critical reflection plane location that is further from the input image plane 214, since the beam can expand with greater intensity to the edges of the MMI structure 208. The exact location of the critical reflection plane 220 may depend on the demands of the application for which the coupling device 200 is being used, the design of the MMI structure including the materials from which it is formed, and the material composition and sizes of the waveguide structures.

Figure 3:
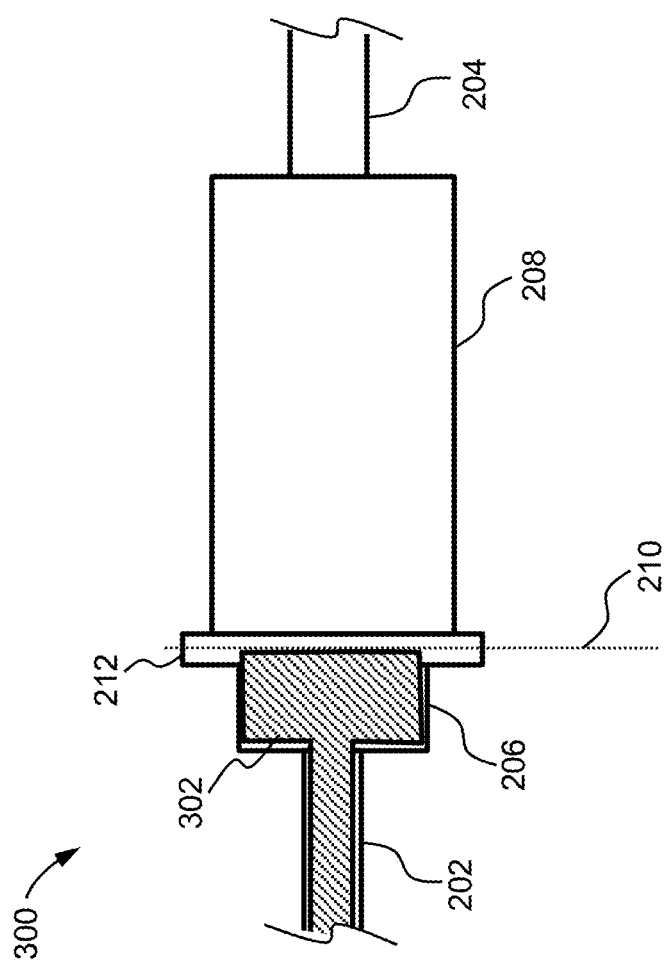
FIGS. 3-6 are schematic diagrams of top views of alternative examples of coupling devices with electrodes for supplying current for achieving optical gain.

FIG. 3 shows an example of a coupling device 300 in which an electrode 302 covers a portion of the top surface of the input waveguide structure 202 and a portion of the top surface of the compound MMI structure. In this example, the guiding core structure between the cladding structures of the shallow etch input side (to the left of the line 210 indicating the butt joint plane) is formed from a material that is able to provide optical gain when a voltage is applied to the electrode 302 to provide an electric field that drives an electric current (also called a pump current) through the material of the guiding core. For example, the guiding core structure can be formed as a layer of a direct bandgap semiconductor material (e.g., indium gallium arsenide phosphide, or doped indium phosphide). The input side is configured in this way to serve as a semiconductor optical amplifier (SOA). In this example, the electrode has an edge that is substantially contained in the butt joint plane within the transition structure 212 as shown in FIG. 3 by an edge of the electrode 302 being substantially coincident with the line 210. In this way, substantially all of the input side guiding core material is pumped to provide optical gain, leaving essentially none of the guiding core material unpumped such that optical loss would be encountered instead of optical gain. Also, essentially none of the guiding core material on the output side is exposed to the electric current provided by the electrode 302, which could result in a reduction in SOA efficiency on the input side, and could jeopardize the service life of the device by electrically over-stressing the butt joint 210. Pumping carriers into the butt-joint boundary itself could have unpredictable results depending on the exact geometry in this area but could also result in reduced efficiency of the input-side SOA, as well as potential reliability issues.

Figure 4:
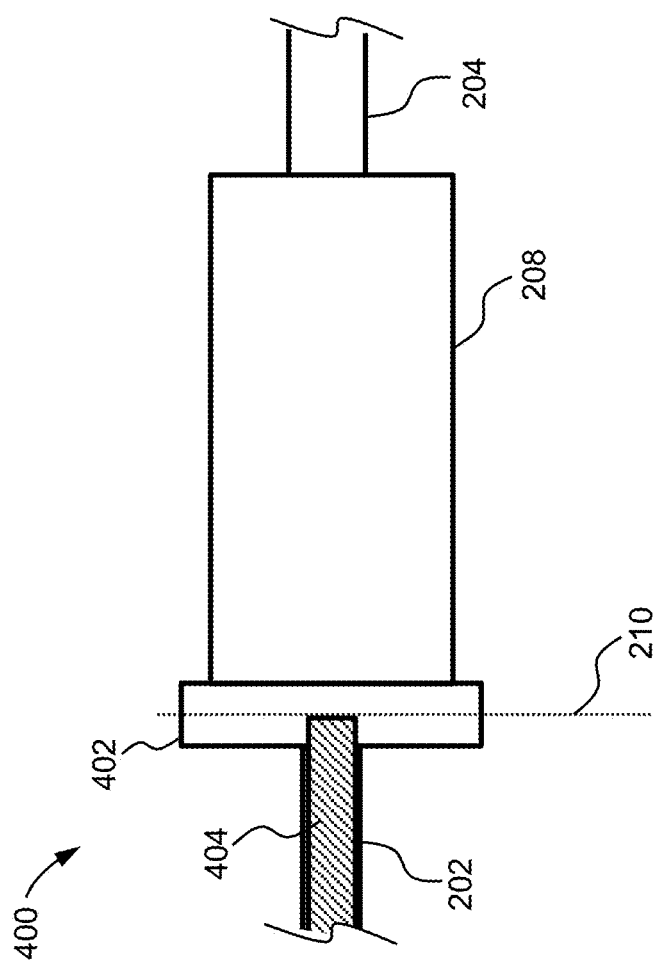
Figure 5:
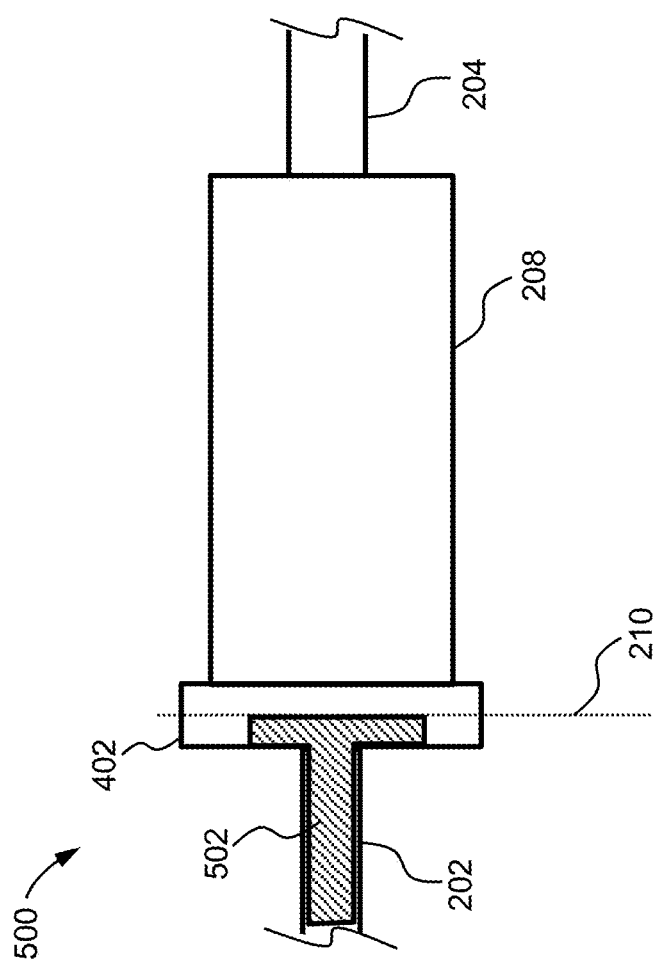

FIGS. 4 and 5 show examples of coupling devices 400 and 500, respectively, that include the output MMI structure 208 but not the input MMI structure 206. The coupling device 400 includes a transition structure 402 that is directly between the input waveguide structure 202 and the output MMI structure 208. An electrode 404 covers a portion of the top surface of the input waveguide structure 202 and a portion of the top surface of the transition structure 402 up to the line 210 indicating the butt joint plane. The coupling device 500 includes an electrode 502 that has an edge that extends to the line 210 indicating the butt joint plane, and that also extends further along that line to ensure that more of the guiding core material underneath is pumped to increase optical gain and reduce optical loss.

Figure 6:
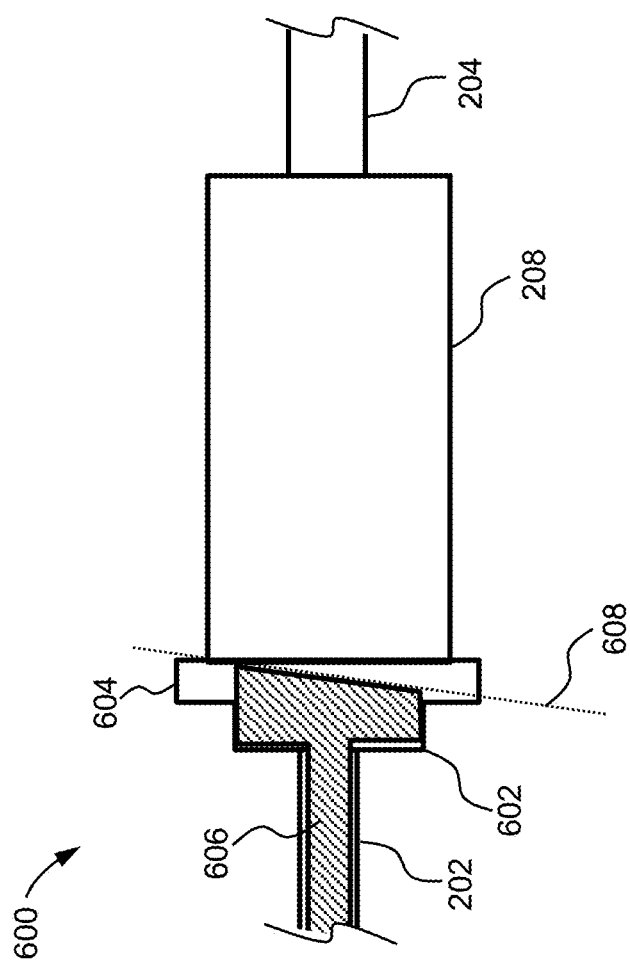

FIG. 6 shows an example of a coupling device 600 that does include an input MMI structure 602, and an electrode 606, but has a tilted butt joint plane, indicated by the line 608, which corresponds to the butt joint between the two guiding core structures underneath crossing the transition structure 604 at an angle (e.g., 5 to 20 degrees from the angle 210 of the transverse butt joint plane). So, in this example, the butt joint plane is not parallel to the input image plane (and thus also not parallel to the critical reflection plane, the transform plane, or the output image plane). This tilted butt joint plane ensures that any reflections at the butt joint have a further reduced coupling strength back to the input image plane.

Figure 7:
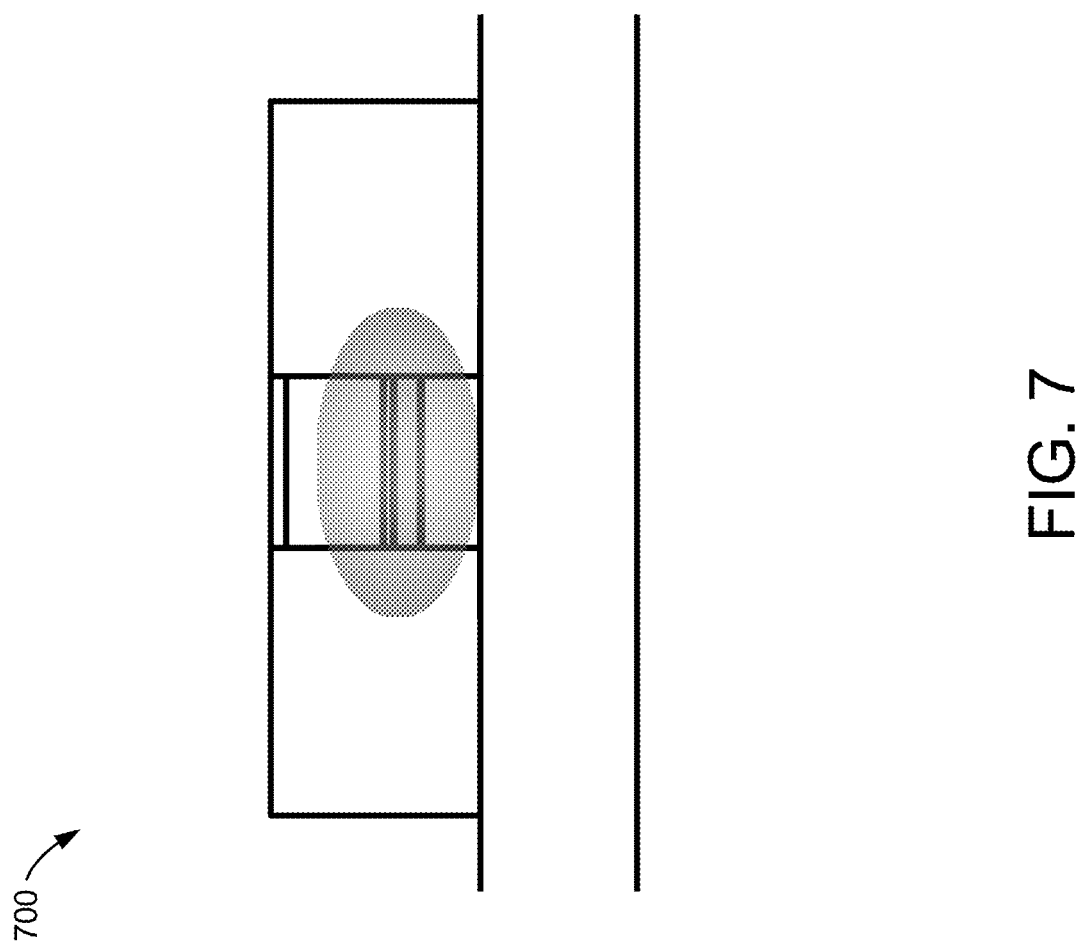
FIG. 7 is a schematic diagram showing a cross-sectional view of a distribution of optical intensity for an optical mode guided by buried heterostructure.

Other examples of coupling devices that provide optical gain are possible. For example, in alternative implementations the deep etch output side instead of the shallow etch input side is configured to provide optical gain with an appropriate guiding core (e.g., doped semiconductor material, or other carrier-pumped optical gain structures, which can include bulk material, multi-quantum wells, and/or quantum dots that are formed of semiconductor materials with specially-designed bandgaps and dimensions). Also, the structure of the input waveguide and/or the output waveguide can have any of a variety of configurations (e.g., a buried heterostructure SOA). For example, FIG. 7 shows an example of cross-sectional view of a buried heterostructure arrangement 700 that could be formed on the input side, including a distribution of optical intensity for a guided optical mode. FIGS. 8A-8E show a series of fabrication steps that can be performed to arrive at such a buried heterostructure arrangement. An initial state is shown in FIG. 8A, where an unetched structure 800 includes a guiding core layer 801. FIG. 8B shows a mask 802 that will preserve a portion of the structure 800 that will include a guiding core. After selective etching, FIG. 8C shows an intermediate stage in which there has been a deep etch (e.g., etched all the way through the core layer) to form a guiding core 804. FIG. 8D shows a mask 806 that will allow selective epitaxy to build up a semiconductor infill 808 on either side of the etched areas shown in FIG. 8E. The resulting buried heterostructure 810 is a buried ridge structure with essentially zero etch depth (measured from this final state rather than the intermediate state during fabrication). The buried heterostructure 810 is also weakly laterally guided similar to the shallow etch input structure, in part due to the semiconductor infill 808 acting as lateral cladding structures having an index of refraction that is slightly lower than the index of refraction of the guiding core 804.

Figure 9A:
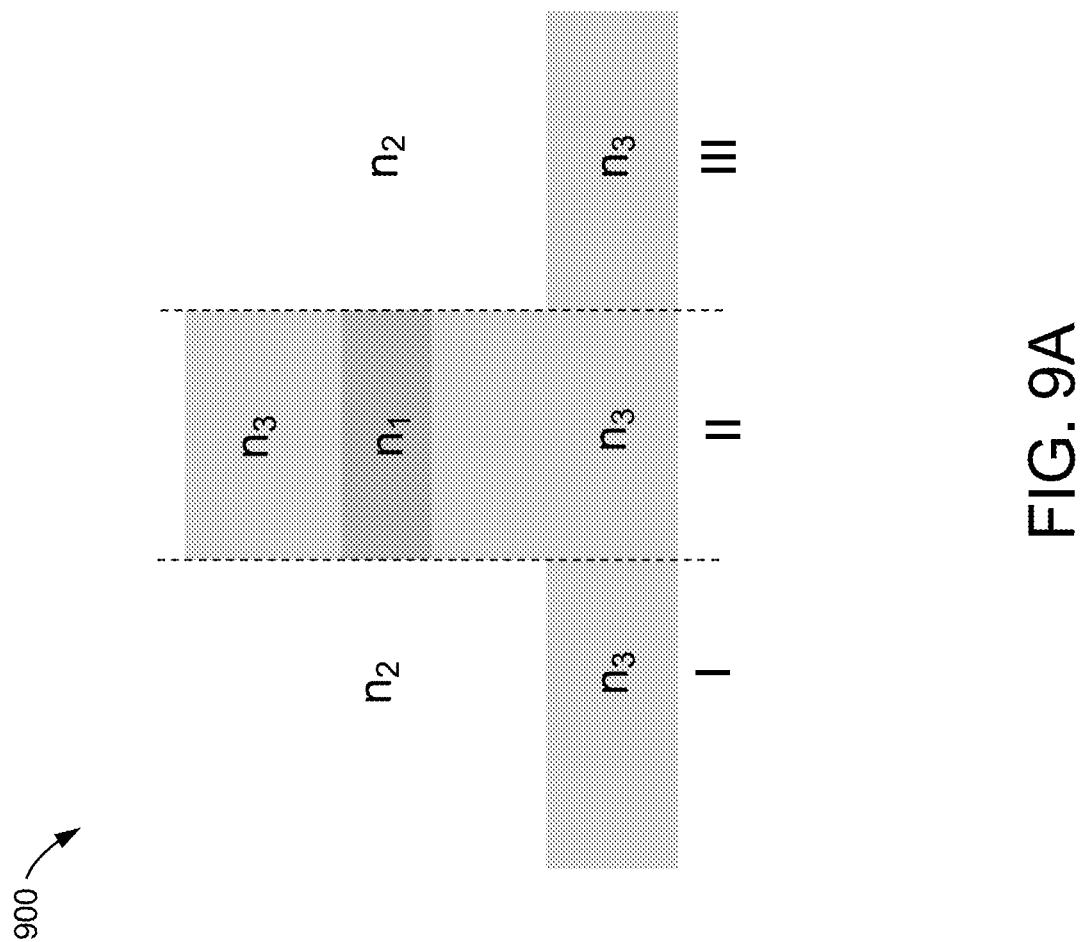
Figure 9B:
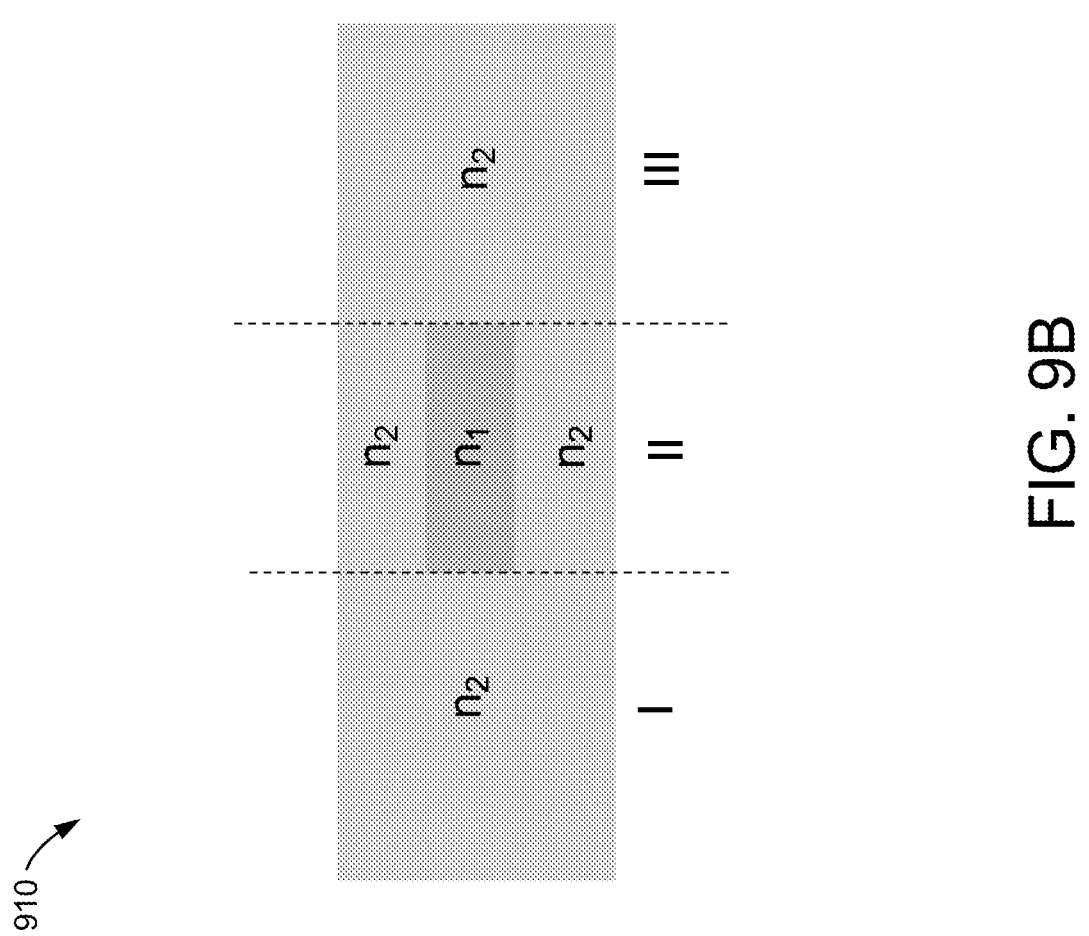

Referring to FIGS. 9A-9C, a waveguide may be considered to have strong or weak lateral guiding depending on its material composition and geometry. FIG. 9A shows an example of a waveguide configuration 900, shown in cross-section, with a guiding core of index n1. The direction of optical propagation is into the page. On either side of the guiding core, in sections marked I and III, is a lateral cladding material of lower index of refraction, n2<n1. Note that typically the guiding core is also clad in the orthogonal direction, referred to as the transverse direction, with other cladding materials, often referred to as upper and lower cladding, of index n3<n1. Although strictly speaking the definition of lateral and transverse directions is arbitrary, customarily in semiconductor optics lateral refers to directions parallel to or in the plane of the wafer surface, and transverse refers to the direction perpendicular to the wafer surface.

The waveguide configuration 900 shown FIG. 9A is an example of strong lateral guiding. The effective lateral index contrast, defined by $\Delta=(n1-n2)$, can be used to quantify a degree of strong or weak lateral guiding. In this example of strong lateral guiding, A is large, for example $\Delta>1$. For example, a core comprised of indium gallium arsenide phosphide might, in some implementations, have a refractive index of n1=3.4, and it might have a lateral cladding of silicon dioxide with a refractive index of n2=1.5, resulting in a large index contrast of $\Delta=1.9$.

By comparison, a waveguide configuration 910, shown in cross-section in FIG. 9B is an example of weak lateral guiding. In weakly laterally guided waveguides, the effective lateral index contrast is small, for example $\Delta<0.5$. Using the same core as in the configuration 900 with n1=3.4, the lateral cladding material might consist of indium phosphide with a refractive index of n2=3.17, resulting in an effective lateral index contrast of $\Delta=0.23$. Such a structure is sometimes known as a buried ridge or a buried heterostructure.

Other configurations are possible. For example, a waveguide configuration 920, shown in cross-section in FIG. 9C is a rib-guided or shallow ridge waveguide and is a further example of weak lateral guiding. Since n1 appears to either side of the central guiding core, it may appear at first as if the effective lateral index contrast is $\Delta=0$. However, the transverse columns I and III have a different effective index relative to the effective index of column II owing to the added n2 above the core in column II. In this type of configuration, the effective lateral index contrast can be very weak. For example, if n1=3.4, n2=3.17 and n3=1, the effective lateral index contrast between section II and I, and section II and III, can be as low as $\Delta=0.01$.

In general, the described and other geometrical and material configurations are possible. In some implementations it is advantageous that various implementations of coupling devices described herein are able to provide an efficient optical transition from a waveguide of one geometry and effective lateral index contrast $\Delta_1$ to a waveguide of different geometry and effective lateral index contrast $\Delta_2$.

Figure 10:
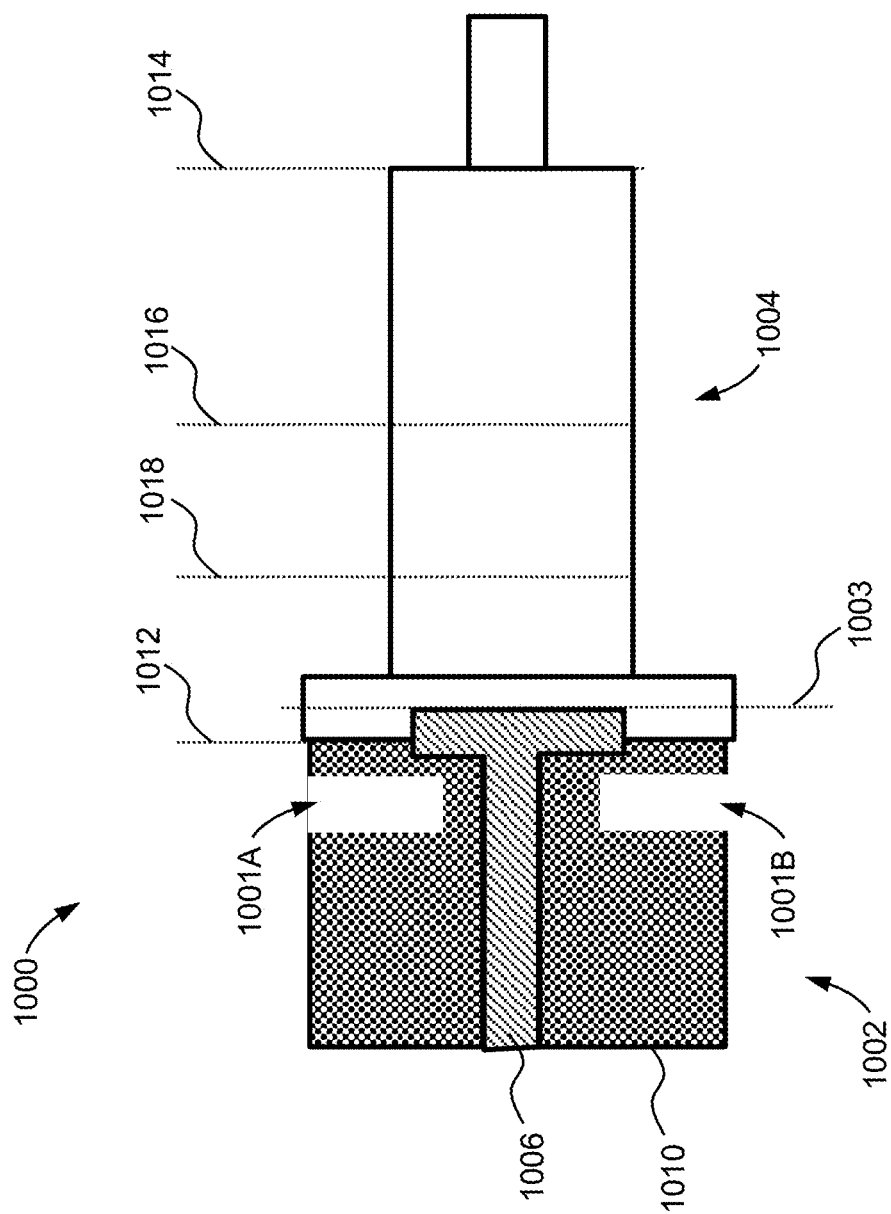
FIG. 10 is a schematic diagram of a top view of an example coupling device.

FIG. 10 shows an example implementation of a coupling device 1000 in which aperture notches 1001A and 1001B have been added to an input structure 1002. There is also an output structure 1004 on the other side of a line 1003 indicating a butt joint plane, and an electrode 1006. Also shown are an input image plane 1012, an output image plane 1014, a transform plane 1016, and a critical reflection plane 1018. Depending on the structure of the input waveguide, it is possible for unwanted light to propagate in the lower guiding layers 1010 and degrade the output image. This light can be filtered out by adding a narrower aperture prior to entering the input image plane 1012. For example, when the input waveguide has the geometry shown by FIG. 2B, these aperture notches would etch through the input core material 222 and significantly reduce the amount of unwanted light that enters this transition structure and is subsequently imaged at the output image plane 1014 of FIG. 10.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An article of manufacture, comprising:
   a first waveguide structure supporting a first optical mode coupled to a waveguide coupling structure, the first waveguide structure comprising
      a first guiding core structure formed on a first cladding structure, and
      a second cladding structure formed on the first guiding core structure,
      where the first waveguide structure has a guiding ridge of a first width; and
   a second waveguide structure supporting a second optical mode coupled to the waveguide coupling structure, the second waveguide structure comprising
      a second guiding core structure formed on a third cladding structure, and
      a fourth cladding structure formed on the second guiding core structure,
      where the second waveguide structure has a guiding ridge of a second width;
   where the waveguide coupling structure comprises
      a transition structure having a third width larger than the first width and larger than the second width, and
      a multimode interference structure between the transition structure and the second waveguide structure having a width larger than the second width and smaller than the third width;

where the first waveguide structure includes a first aperture notch on a first side of the first waveguide structure and a second aperture notch on a second side of the first waveguide structure to provide a narrower aperture in a proximal portion of first waveguide structure that is narrower than a distal portion of the first waveguide structure without aperture notches;

where the proximal portion of the first waveguide structure is closer in proximity to the transition structure than the distal portion of the first waveguide structure; and where each of the first and second aperture notches is etched from a top of the second cladding structure, through a portion of the first guiding core structure, and into a portion of the first cladding structure.

2. The article of manufacture of claim 1, where
the guiding ridge of the first waveguide structure has a first depth relative to a top plane that is above a radius of the first optical mode;
the guiding ridge of the second waveguide structure has a second depth relative to the top plane that is larger than the first depth; and
the multimode interference structure has a height substantially equal to the second depth.

3. The article of manufacture of claim 2, where the first depth of the guiding ridge of the first waveguide structure extends to a plane within the second cladding structure.

4. The article of manufacture of claim 3, where the second depth of the guiding ridge of the second waveguide structure extends through the fourth cladding structure to a plane within the third cladding structure.

5. The article of manufacture of claim 1, where the first waveguide structure is characterized by a first effective lateral index contrast associated with the first optical mode, and the second waveguide structure is characterized by a second effective lateral index contrast associated with the second optical mode that is larger than the first effective lateral index contrast.

6. The article of manufacture of claim 5, where the guiding ridge of the second waveguide structure is more deeply etched than the guiding ridge of the first waveguide structure.

7. The article of manufacture of claim 5, where the first waveguide structure comprises a buried heterostructure waveguide.

8. The article of manufacture of claim 1, where the first width of the guiding ridge of the first waveguide structure is different from the second width of the guiding ridge of the second waveguide structure.

9. The article of manufacture of claim 1, where the narrower aperture provided by the first and second aperture notches is narrower than the width of the multimode interference structure.

10. The article of manufacture of claim 1, where the first guiding core structure is configured to provide optical gain.

11. The article of manufacture of claim 1, where
the guiding ridge of the first waveguide structure has a first depth relative to a top plane; and
the guiding ridge of the second waveguide structure has a second depth relative to the top plane that is larger than the first depth.

12. The article of manufacture of claim 11, where the second waveguide structure is configured to provide a substantially constant aperture free of any aperture notches on both sides of the second waveguide structure over at least a distance from the waveguide coupling structure that is longer than a distance of the first and second aperture notches of the first waveguide structure from the waveguide coupling structure.

13. The article of manufacture of claim 1, where
the first waveguide structure is adjacent to the transition structure of the waveguide coupling structure; and
the multimode interference structure is configured to have a substantially constant width between the transition structure and the second waveguide structure.

14. A method for fabricating an integrated optical coupler, the method comprising:
forming a first waveguide structure supporting a first optical mode coupled to a waveguide coupling structure, the first waveguide structure comprising
a first guiding core structure formed on a first cladding structure, and
a second cladding structure formed on the first guiding core structure,
where the first waveguide structure has a guiding ridge of a first width; and
forming a second waveguide structure supporting a second optical mode coupled to the waveguide coupling structure, the second waveguide structure comprising
a second guiding core structure formed on a third cladding structure, and
a fourth cladding structure formed on the second guiding core structure,
where the second waveguide structure has a guiding ridge of a second width;
where the waveguide coupling structure comprises
a transition structure having a third width larger than the first width and larger than the second width, and
a multimode interference structure between the transition structure and the second waveguide structure having a width larger than the second width and smaller than the third width;
where the first waveguide structure includes a first aperture notch on a first side of the first waveguide structure and a second aperture notch on a second side of the first waveguide structure to provide a narrower aperture in a proximal portion of first waveguide structure that is narrower than a distal portion of the first waveguide structure without aperture notches;
where the proximal portion of the first waveguide structure is closer in proximity to the transition structure than the distal portion of the first waveguide structure; and
where each of the first and second aperture notches is etched from a top of the second cladding structure, through a portion of the first guiding core structure, and into a portion of the first cladding structure.

15. The method of claim 14, where the narrower aperture provided by the first and second aperture notches is narrower than the width of the multimode interference structure.

16. The method of claim 14, where the second waveguide structure provides a substantially constant aperture free of any aperture notches on both sides of the second waveguide structure over at least a distance from the waveguide coupling structure that is longer than a distance of the first and second aperture notches of the first waveguide structure from the waveguide coupling structure.

17. A method for using an integrated optical coupler, the method comprising:
providing a first optical wave into a first waveguide structure supporting a first optical mode coupled to a waveguide coupling structure, the first waveguide structure comprising a first guiding core structure formed on a first cladding structure, and a second cladding structure formed on the first guiding core structure, where the first waveguide structure has a guiding ridge of a first width; and receiving the first optical wave out of a second waveguide structure supporting a second optical mode coupled to the waveguide coupling structure, the second waveguide structure comprising a second guiding core structure formed on a third cladding structure, and a fourth cladding structure formed on the second guiding core structure, where the second waveguide structure has a guiding ridge of a second width;

where the waveguide coupling structure comprises a transition structure having a third width larger than the first width and larger than the second width, and a multimode interference structure between the transition structure and the second waveguide structure having a width larger than the second width and smaller than the third width;

where the first waveguide structure includes a first aperture notch on a first side of the first waveguide structure and a second aperture notch on a second side of the first waveguide structure to provide a narrower aperture in a proximal portion of first waveguide structure that is narrower than a distal portion of the first waveguide structure without aperture notches;

where the proximal portion of the first waveguide structure is closer in proximity to the transition structure than the distal portion of the first waveguide structure; and where each of the first and second aperture notches is etched from a top of the second cladding structure, through a portion of the first guiding core structure, and into a portion of the first cladding structure.

18. The method of claim 17, further comprising providing a second optical wave into the second waveguide structure; and receiving the second optical wave out of the first waveguide structure.

19. The method of claim 17, where the first width of the guiding ridge of the first waveguide structure is different from the second width of the guiding ridge of the second waveguide structure.

20. The method of claim 17, where the second waveguide structure provides a substantially constant aperture free of any aperture notches on both sides of the second waveguide structure over at least a distance from the waveguide coupling structure that is longer than a distance of the first and second aperture notches of the first waveguide structure from the waveguide coupling structure.

* * * * *